US011043826B2

(12) United States Patent
Maetani

(10) Patent No.: US 11,043,826 B2
(45) Date of Patent: Jun. 22, 2021

(54) CHARGE/DISCHARGE CONTROL CIRCUIT AND BATTERY DEVICE INCLUDING THE SAME

(71) Applicant: SII Semiconductor Corporation, Chiba (JP)

(72) Inventor: Fumihiko Maetani, Chiba (JP)

(73) Assignee: ABLIC INC., Chiba (JP)

( * ) Notice: Subject to any disclaimer, the term of this patent is extended or adjusted under 35 U.S.C. 154(b) by 359 days.

(21) Appl. No.: 15/667,084

(22) Filed: Aug. 2, 2017

(65) Prior Publication Data

US 2018/0041056 A1 Feb. 8, 2018

(30) Foreign Application Priority Data

Aug. 4, 2016 (JP) .............................. JP2016-153830

(51) Int. Cl.
*H02J 7/00* (2006.01)
*G01R 31/3842* (2019.01)
*G01R 31/364* (2019.01)

(52) U.S. Cl.
CPC .......... *H02J 7/0031* (2013.01); *H02J 7/0068* (2013.01); *H02J 7/007184* (2020.01);
(Continued)

(58) Field of Classification Search
CPC ...... H02J 7/0031; H02J 7/0063; H02J 7/0068; H02J 7/0081; H02J 2007/0039; G01R 31/3842; G01R 31/364
(Continued)

(56) References Cited

U.S. PATENT DOCUMENTS

2004/0109274 A1* 6/2004 Sato ...................... H02J 7/0031
361/90
2005/0285572 A1* 12/2005 Geren ................... H02J 7/0029
320/134

(Continued)

FOREIGN PATENT DOCUMENTS

| JP | 2010-270091 | 10/1998 |
|----|-------------|---------|
| JP | 2014-121169 | 6/2014 |
| JP | 2015-133893 A | 7/2015 |

OTHER PUBLICATIONS

Applicant's admitted prior art pp. 3-5; Par. 10-19; Fig.3.*
(Continued)

*Primary Examiner* — Richard Isla
*Assistant Examiner* — Johali A Torres Ruiz
(74) *Attorney, Agent, or Firm* — Brinks Gilson & Lione

(57) ABSTRACT

Provided is a charge/discharge control circuit for controlling charging and discharging of a secondary cell. The charge/discharge control circuit includes a positive power supply terminal and a negative power supply terminal configured to monitor a voltage of the secondary cell, a charge control signal output terminal from which a charge control signal is output, the charge control signal controlling stopping and allowing charging of the secondary cell, a discharge control signal output terminal, an overcurrent detection terminal, an overcurrent cancel terminal, an external voltage input terminal provided separately from the overcurrent cancel terminal, a discharge overcurrent detection circuit connected to the overcurrent detection terminal, to which a discharge overcurrent detection voltage is set, and a discharge overcurrent cancel circuit connected to the overcurrent cancel terminal, to which a discharge overcurrent cancel voltage is set.

13 Claims, 3 Drawing Sheets

(52) U.S. Cl.
CPC ........ *G01R 31/364* (2019.01); *G01R 31/3842* (2019.01); *H02J 7/0029* (2013.01); *H02J 7/0063* (2013.01); *H02J 7/00304* (2020.01); *H02J 7/00306* (2020.01)

(58) Field of Classification Search
USPC .......................................... 320/134
See application file for complete search history.

(56) References Cited

U.S. PATENT DOCUMENTS

| | | | | |
|---|---|---|---|---|
| 2014/0167702 A1* | 6/2014 | Sakurai | ................ | H02J 7/0029 320/134 |
| 2015/0162775 A1* | 6/2015 | Ono | ...................... | H02J 7/0029 320/134 |
| 2017/0033574 A1* | 2/2017 | Imaizumi | ............. | H02J 7/0072 |

OTHER PUBLICATIONS

Notice of reasons for refusal issued in corresponding Japanese Patent Application No. 2016-153830 drafted on Mar. 23, 2020 and dated Apr. 1, 2020 (2nd year of Reiwa) (6 pages).

\* cited by examiner

CHARGE/DISCHARGE CONTROL CIRCUIT AND BATTERY DEVICE INCLUDING THE SAME

RELATED APPLICATIONS

This application claims priority under 35 U.S.C. § 119 to Japanese Patent Application No. 2016-153830 filed on Aug. 4, 2016, the entire content of which is hereby incorporated by reference.

BACKGROUND OF THE INVENTION

1. Field of the Invention

The present invention relates to a charge/discharge control circuit and a battery device including the charge/discharge control circuit.

2. Description of the Related Art

A battery device generally includes a charge/discharge control device including a charge/discharge control circuit configured to detect overcharge, overdischarge, discharge overcurrent, and charge overcurrent, to thereby control charging and discharging.

Of the detections described above, the detection of discharge overcurrent is performed by monitoring, with a voltage at an overcurrent detection terminal, discharge current flowing from a battery device to a load, and by determining the discharge current to be a discharge overcurrent when the voltage at the overcurrent detection terminal exceeds a predetermined discharge overcurrent detection voltage after occurrence of an abnormal event at the load which increases the discharge current.

When detecting the discharge overcurrent, a charge/discharge control circuit outputs a discharge stop signal from its discharge control signal output terminal to turn off a discharge control FET of the charge/discharge control device, to thereby stop discharging (this is referred to as "discharge overcurrent state"). After the discharging is stopped, when the load returns to a normal state and the voltage at the overcurrent detection terminal falls below the discharge overcurrent detection voltage, the charge/discharge control circuit stops outputting the discharge stop signal to turn on the discharge control FET, to thereby resume discharging.

However, even though the load connected to the battery device returns to the normal state after the discharge overcurrent is detected and discharging is stopped, when the impedance of the load is small, discharging is not resumed in some cases because the voltage at the overcurrent detection terminal does not fall below the discharge overcurrent detection voltage.

Against the circumstance, there has been proposed a battery device including a charge/discharge control device including a discharge overcurrent cancel circuit (for example, see Japanese Patent Application Laid-open No. 2015-133893). Specifically, the charge/discharge control device includes the discharge overcurrent cancel circuit configured to cancel a discharge overcurrent state based on a voltage at an overcurrent detection terminal, and switches, depending on the voltage value of the voltage at the overcurrent detection terminal after the detection of discharge overcurrent, the voltage value of a cancel voltage set to the discharge overcurrent cancel circuit between a first voltage value identical to the discharge overcurrent detection voltage, and a second voltage value that is higher than the first voltage value and is close to the voltage of a secondary cell. Then, the charge/discharge control device resumes discharging when the voltage at the overcurrent detection terminal falls below the cancel voltage. With this configuration, even when the voltage at the overcurrent detection terminal does not drop enough due to the small impedance of a load, a discharge overcurrent state can be canceled through switching of the cancel voltage to the second voltage value.

Meanwhile, battery devices including two charge/discharge control devices are often used currently in order to provide safer battery devices.

FIG. 3 is a block diagram for illustrating a battery device 30 including two charge/discharge control devices each including a charge/discharge control circuit having a discharge overcurrent cancel circuit similar to the one described above.

The battery device 30 of FIG. 3 includes a secondary cell SC, and first and second charge/discharge control devices 31a and 31b that are connected to the secondary cell SC and have the identical configuration each other.

The charge/discharge control device 31a (31b) includes a charge/discharge control circuit 310a (310b), a discharge control FET 321a (321b), and a charge control FET 322a (322b).

The charge/discharge control circuit 310a (310b) includes terminals T31a to T35a (T31b to T35b), a control circuit 311a (311b) configured to control the charge control FET 322a (322b) and the discharge control FET 321a (321b) based on the detection of overcharge, overdischarge, or the like, a discharge overcurrent detection circuit 312a (312b) configured to receive a voltage at the terminal T35a (T35b) as an overcurrent detection voltage VDa (VDb), and a discharge overcurrent cancel circuit 313a (313b) configured to receive the voltage at the terminal T35a (T35b) as an overcurrent cancel voltage VRa (VRb), and these elements are connected as illustrated in FIG. 3.

Further, the control circuit 311a (311b) is configured to, in detecting overcharge, receive the voltage at the terminal T35a (T35b) as an external voltage VMa (VMb), and output the external voltage VMa (VMb) as a charge control signal via the terminal T34a (T34b) to turn off the charge control FET 322a (322b), thereby stopping charging.

According to the battery device 30 including the two charge/discharge control devices 31a and 31b as described above, safety of the battery device 30 can be enhanced even when the first charge/discharge control device 31a fails to operate, since the second charge/discharge control device 31b operates.

Now the operation of the battery device 30 illustrated in FIG. 3 is considered in more detail.

First, the following case is considered. Specifically, under a normal state, which is a state in which the charge control FETs 322a and 322b and the discharge control FETs 321a and 321b are all in ON state, excessive discharge current flows due to the occurrence of an abnormal event in a load (not shown) connected between an external positive terminal EP and an external negative terminal EN of the battery device 30, increasing the voltage at the terminal T35a, which is the overcurrent detection voltage VDa, and the voltage at the terminal T35b, which is the overcurrent detection voltage VDb.

In the charge/discharge control circuit 310b (also referred to as "secondary cell-side charge/discharge control circuit"), when the discharge overcurrent detection circuit 312b detects that the overcurrent detection voltage VDb exceeds the discharge overcurrent detection voltage set to the discharge overcurrent detection circuit 312b, the control circuit 311b outputs a discharge stop signal via the terminal T33b to turn off the discharge control FET 321b to stop discharging, thereby carrying out a discharge overcurrent protection.

If the discharge overcurrent is not detected in the charge/discharge control circuit 310a at this time, the discharge control FET 321a that has been in ON state of which a gate voltage is HIGH level (voltage level of secondary cell) and a source voltage is LOW level is turned off because a voltage at a node N3 being the source increases and a gate-source voltage of the discharge control FET 321a falls below the threshold voltage of the discharge control FET 321a, due to the turning off of the discharge control FET 321b. Then, the node N3 is separated from the external negative terminal EN, and is connected to the negative electrode of the secondary cell SC via the terminal T35b, a pull-down resistor (not shown) in the discharge overcurrent cancel circuit 313b, and the terminal T32b. The voltage at the node N3 thus drops. However, when the voltage at the node N3 drops, the gate-source voltage of the discharge control FET 321a exceeds the threshold voltage, and the discharge control FET 321a is thus turned on again. Such states are repeated. As a result, the voltage at the node N3 is settled at a voltage lower than the voltage of the secondary cell SC by the threshold voltage of the discharge control FET 321a.

The voltage at the terminal T35b, which is the overcurrent cancel voltage VRb, only increases up to the voltage lower than the voltage of the secondary cell SC by the threshold voltage of the discharge control FET 321a as described above. Hence, the cancel voltage set to the discharge overcurrent cancel circuit 313b is not switched to the second voltage value.

Consequently, the discharge overcurrent cancel circuit 313b does not work, and the charge/discharge control circuit 310b may not return to a normal state in the case of small impedance of the load since the cancel voltage set to the discharge overcurrent cancel circuit 313b is kept at the first voltage value when the load connected to the battery device 30 returns to the normal state and even the voltage at the node N3 drops.

SUMMARY OF THE INVENTION

In a configuration of a battery device including two charge/discharge control devices each having a discharge overcurrent cancel circuit, the present invention provides a charge/discharge control circuit and a battery device in which a discharge overcurrent cancel circuit works to turn on a discharge control FET, even the impedance of a load connected to the battery device is small, so that discharging resumes when the load returns to a normal state after a voltage at an overcurrent detection terminal of the secondary cell-side charge/discharge control circuit exceeds a discharge overcurrent detection voltage and the discharge control FET is turned off due to the occurrence of an abnormal event in the load.

In one embodiment of the present invention, there is provided a charge/discharge control circuit for controlling charging and discharging of a secondary cell, the charge/discharge control circuit including: a positive power supply terminal and a negative power supply terminal configured to monitor a voltage of the secondary cell; a charge control signal output terminal outputting a charge control signal which controls stopping and allowing of charging to the secondary cell; a discharge control signal output terminal outputting a discharge control signal, the discharge control signal becoming a first voltage level to stop discharging of the secondary cell, and becoming a second voltage level to allow discharging of the secondary cell; an overcurrent detection terminal; an overcurrent cancel terminal; an external voltage input terminal provided separately from the overcurrent cancel terminal; a discharge overcurrent detection circuit connected to the overcurrent detection terminal, to which a discharge overcurrent detection voltage is set; and a discharge overcurrent cancel circuit connected to the overcurrent cancel terminal, to which a discharge overcurrent cancel voltage is set, the charge control signal being set to a voltage at the external voltage input terminal when the charging to the secondary cell is stopped, the discharge control signal being set to the first voltage level when a voltage at the overcurrent detection terminal exceeds the discharge overcurrent detection voltage, and the discharge control signal being set to the second voltage level when a voltage at the overcurrent cancel terminal falls below the discharge overcurrent cancel voltage.

Further, in one embodiment of the present invention, there is provided a battery device including: a secondary cell; an external terminal to which a load and a charger are connected; a first charge/discharge control circuit and a second charge/discharge control circuit connected to the secondary cell; a first charge control FET configured to be controlled to be turned on and off by a first charge control signal output from the first charge/discharge control circuit, and having one end connected to the external terminal; a first discharge control FET configured to be controlled to be turned on and off by a first discharge control signal output from the first charge/discharge control circuit, and having one end connected to the other end of the first charge control FET; a second charge control FET configured to be controlled to be turned on and off by a second charge control signal output from the second charge/discharge control circuit, and having one end connected to the other end of the first discharge control FET; and a second discharge control FET configured to be controlled to be turned on and off by a second discharge control signal output from the second charge/discharge control circuit, and having one end connected to the other end of the second charge control FET, and the other end connected to the secondary cell, the second charge/discharge control circuit having: an overcurrent detection terminal; an overcurrent cancel terminal connected to the external terminal; an external voltage input terminal connected to the one end of the second charge control FET and configured to receive a voltage turning off the second charge control FET; a discharge overcurrent detection circuit, to which a discharge overcurrent detection voltage set, and configured to turn off the second discharge control FET when a voltage at the overcurrent detection terminal exceeds the discharge overcurrent detection voltage; and a discharge overcurrent cancel circuit, to which a discharge overcurrent cancel voltage is set, and configured to turn on the second discharge control FET when a voltage at the overcurrent cancel terminal falls below the discharge overcurrent cancel voltage.

According to the present invention, the overcurrent cancel terminal is provided separately from the external voltage input terminal, and hence the overcurrent cancel terminal can be connected to the external terminal to which a load is connected. As a result, after discharge overcurrent is detected based on a voltage at the overcurrent detection terminal and discharging of the secondary cell is stopped, when a voltage at the overcurrent cancel terminal falls below the discharge overcurrent cancel voltage, discharging is allowed so that the charge/discharge control circuit can return to the normal state. There can therefore be provided the charge/discharge control circuit and the safer battery device including the two charge/discharge control circuits that are capable of positively returning from a discharge overcurrent detection state to the normal state.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENTS

The invention will be now described herein with reference to illustrative embodiments.

Figure 1:
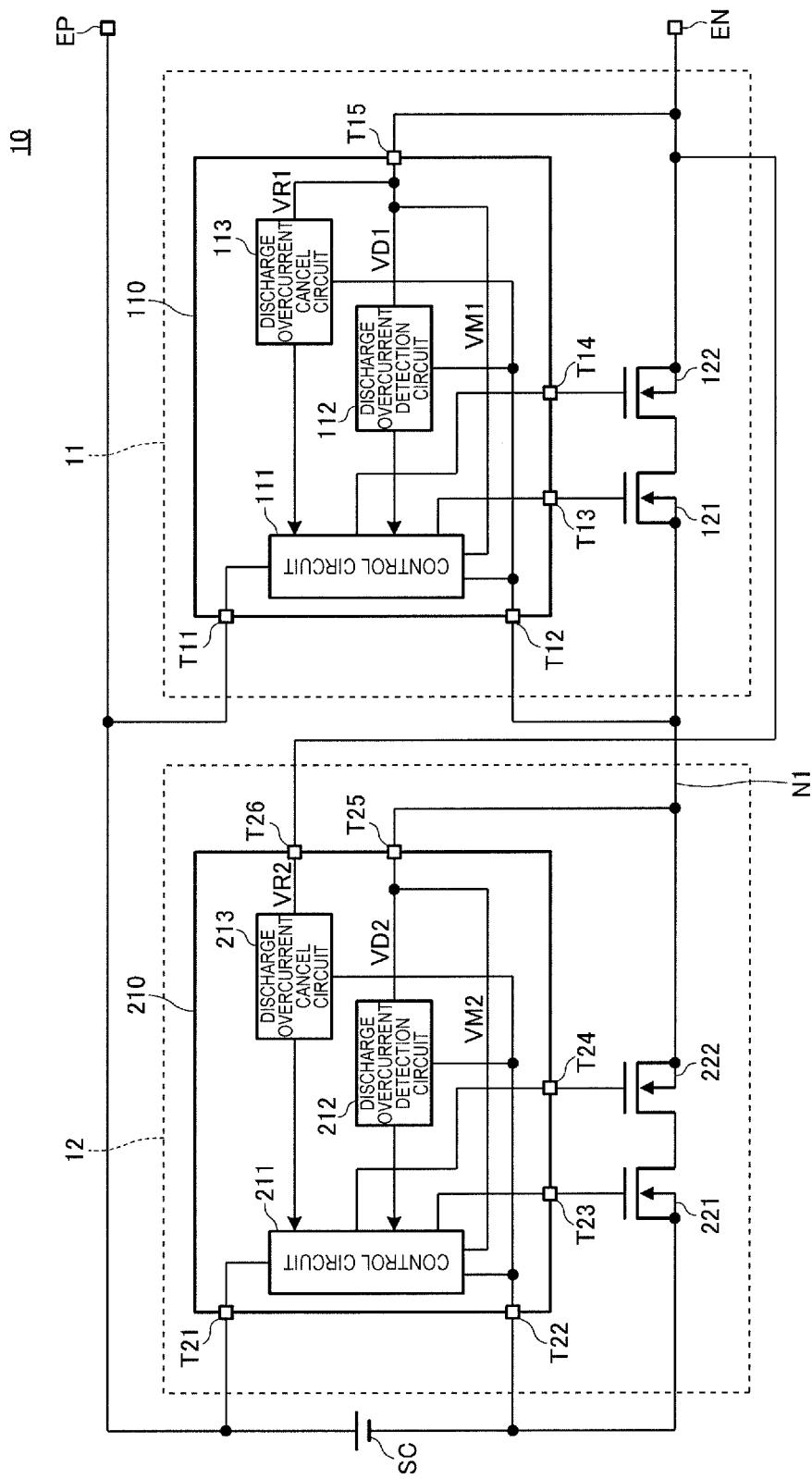
FIG. 1 is a block diagram for illustrating a battery device according to a first embodiment of the present invention.

FIG. 1 is a block diagram for illustrating a battery device 10 according to a first embodiment of the present invention.

The battery device 10 of the first embodiment includes a secondary cell SC, a first charge/discharge control device 11, a second charge/discharge control device 12, an external positive terminal EP, and an external negative terminal (also referred to as "external terminal") EN.

The first charge/discharge control device 11 includes a first charge/discharge control circuit 110, a discharge control FET 121, and a charge control FET 122.

The first charge/discharge control circuit 110 has a positive power supply terminal T11, a negative power supply terminal T12, a discharge control signal output terminal T13, a charge control signal output terminal T14, a terminal T15 serving as an overcurrent detection terminal, an overcurrent cancel terminal, and an external voltage input terminal. Further, the first charge/discharge control circuit 110 includes a control circuit 111 connected to the positive power supply terminal T11 and the negative power supply terminal T12, a discharge overcurrent detection circuit 112 configured to receive a voltage at the terminal T15 as an overcurrent detection voltage VD1, and a discharge overcurrent cancel circuit 113 configured to receive the voltage at the terminal T15 as an overcurrent cancel voltage VR1.

The discharge overcurrent detection circuit 112 has a discharge overcurrent detection voltage set thereto, and the discharge overcurrent cancel circuit 113 has a discharge overcurrent cancel voltage set thereto.

The discharge control FET 121 is controlled to be turned on and off by a first discharge control signal output from the discharge control signal output terminal T13 of the first charge/discharge control circuit 110. The charge control FET 122 is controlled to be turned on and off by a first charge control signal output from the charge control signal output terminal T14.

The second charge/discharge control device 12 includes a second charge/discharge control circuit 210, a discharge control FET 221, and a charge control FET 222.

The second charge/discharge control circuit 210 (also referred to as "secondary cell-side charge/discharge control circuit") has a positive power supply terminal T21, a negative power supply terminal T22, a discharge control signal output terminal T23, a charge control signal output terminal T24, a terminal T25 serving as an overcurrent detection terminal and an external voltage input terminal, and an overcurrent cancel terminal T26. Further, the second charge/discharge control circuit 210 includes a control circuit 211 connected to the positive power supply terminal T21 and the negative power supply terminal T22, a discharge overcurrent detection circuit 212 configured to receive a voltage at the terminal T25 as an overcurrent detection voltage VD2, and a discharge overcurrent cancel circuit 213 configured to receive a voltage at the overcurrent cancel terminal T26 as an overcurrent cancel voltage VR2.

The discharge overcurrent detection circuit 212 has a discharge overcurrent detection voltage set thereto, and the discharge overcurrent cancel circuit 213 has a discharge overcurrent cancel voltage set thereto. Further, the discharge overcurrent cancel voltage whose initial value has been set to a first voltage value is switched to a second voltage value when the voltage value of the voltage at the overcurrent cancel terminal T26 after the detection of discharge overcurrent exceeds the second voltage value.

The discharge control FET 221 is controlled to be turned on and off by a second discharge control signal output from the discharge control signal output terminal T23 of the second charge/discharge control circuit 210. The charge control FET 222 is controlled to be turned on and off by a second charge control signal output from the charge control signal output terminal T24.

The positive power supply terminal T11 of the first charge/discharge control circuit 110 and the positive power supply terminal T21 of the second charge/discharge control circuit 210 are connected to the positive electrode of the secondary cell SC. The negative power supply terminal T12 of the first charge/discharge control circuit 110 is connected to the negative electrode of the secondary cell SC via the charge control FET 222 and the discharge control FET 221. The negative power supply terminal T22 of the second charge/discharge control circuit 210 is connected to the negative electrode of the secondary cell SC.

The charge control FET 122 has one end connected to the external negative terminal EN, and the discharge control FET 121 has one end connected to the other end of the charge control FET 122. The charge control FET 222 has one end connected to the other end of the discharge control FET 121. The discharge control FET 221 has one end connected to the other end of the charge control FET 222, and the other end connected to the negative electrode of the secondary cell SC.

The terminal T15 of the first charge/discharge control circuit 110 is connected to the one end of the charge control FET 122.

The terminal T25 of the second charge/discharge control circuit 210 is connected to the one end (node ND of the charge control FET 222. Further, the overcurrent cancel terminal T26 is connected to the external negative terminal EN.

Next, the operation of the battery device 10 is described below.

First, the operation of the battery device 10 in the following case is described. Specifically, an abnormal event occur in a load (not shown) connected between the external positive terminal EP and the external negative terminal EN of the battery device 10, and discharge overcurrent occurs. The first charge/discharge control circuit 110 does not detect the discharge overcurrent but the second charge/discharge control circuit 210 detects the discharge overcurrent.

In a normal state, the charge control FETs 122 and 222, and the discharge control FETs 121 and 221 are all in ON state, and discharge current flows from the secondary cell SC to the load (not shown) connected between the external positive terminal EP and the external negative terminal EN.

When an abnormal event occurs in the load under this state and discharge current increases, a large current flows through the charge control FET 122, the discharge control FET 121, the charge control FET 222, and the discharge control FET 221.

Consequently, a voltage difference between the negative power supply terminal T22 and the node N1 increases, that is, the voltage at the terminal T25 serving as the overcurrent detection terminal increases. When the overcurrent detection voltage VD2, which is the voltage at the terminal T25, exceeds the discharge overcurrent detection voltage having the first voltage value set to the discharge overcurrent detection circuit 212, the discharge overcurrent detection circuit 212 transmits to the control circuit 211 a signal indicating discharge overcurrent. In response to this, the control circuit 211 changes the second discharge control signal, which is output to the discharge control signal output terminal T23, to LOW level (also referred to as "first voltage level"), thereby turning off the discharge control FET 221. In this way, discharging is stopped, and discharge overcurrent protection is achieved.

At this time, the discharge control FET 121 of the first charge/discharge control device 11 that has been in ON state of which a gate voltage is HIGH level (voltage level of secondary cell) and a source voltage is LOW level is turned off because a voltage at the node N1 being the source increases and a gate-source voltage of the discharge control FET 121 falls below the threshold voltage of the discharge control FET 121, due to the turning off of the discharge control FET 221.

In a discharge overcurrent detection state, the external negative terminal EN and the external positive terminal EP are substantially short-circuited, and a voltage at the external negative terminal EN is equivalent to the voltage of the secondary cell SC. Hence, the voltage at the overcurrent cancel terminal T26 connected to the external negative terminal EN is also equivalent to the voltage of the secondary cell SC.

Consequently, the voltage value of the voltage at the overcurrent cancel terminal T26 exceeds the second voltage value, and the discharge overcurrent cancel voltage is thus switched to the second voltage value from the first voltage value.

As a result, when the load returns to the normal state, and the overcurrent cancel voltage VR2 at the overcurrent cancel terminal T26 falls below the discharge overcurrent cancel voltage being the second voltage value thereafter, the discharge overcurrent cancel circuit 213 transmits to the control circuit 211 a signal for canceling discharge overcurrent. In response to this, the control circuit 211 changes the second discharge control signal, which is output from the discharge control signal output terminal T23, to HIGH level (also referred to as "second voltage level"), thereby turning on the discharge control FET 221. In this way, discharging from the secondary cell SC to the load is resumed.

As described above, according to the first embodiment, the discharge overcurrent cancel circuit 213 is capable of functioning.

Next, the operation of the battery device 10 in the following case is described. Specifically, a charger is connected between the external positive terminal EP and the external negative terminal EN of the battery device 10, and the secondary cell SC is overcharged. The second charge/discharge control circuit 210 does not detect the overcharge but the first charge/discharge control circuit 110 detects the overcharge.

The control circuit 111 monitors a voltage at the positive power supply terminal T11 and a voltage at the negative power supply terminal T12. When determining overcharge of the secondary cell SC based on a voltage difference between those voltages, the control circuit 111 receives the voltage at the terminal T15, which serves as the external voltage input terminal, as an external voltage VM1. The control circuit 111 outputs the external voltage VM1 as the first charge control signal from the charge control signal output terminal T14 to supply the external voltage VM1 to a gate of the charge control FET 122, thereby turning off the charge control FET 122. In this way, charging is stopped.

At this time, the second charge/discharge control circuit 210 does not detect the overcharge, and hence the charge control FET 222 is in ON state. Thus, a voltage input to the terminal T25 is a voltage at the negative terminal of the secondary cell SC.

In contrast, if in the second charge/discharge control circuit 210, the external voltage input terminal T25 is the same terminal as the overcurrent cancel terminal T26, and this terminal is connected to the external negative terminal EN, the voltage input to the external voltage input terminal T25 is a voltage of the charger connected to the external negative terminal EN, because the charge control FET 122 is turned off when the first charge/discharge control circuit 110 detects overcharge. The following problems may arise in this case.

A voltage across the positive electrode and the negative electrode of the charger is generally set to a sufficiently larger value than a voltage across the positive electrode and the negative electrode of the secondary cell SC so that the secondary cell SC may be sufficiently charged. Thus, the voltage at the external negative terminal EN when the charge control FET 122 is in OFF state and the charger is connected is significantly lower than the voltage at the negative electrode of the secondary cell SC. Consequently, when the second charge/discharge control circuit 210 does not detect overcharge, that is, is in a normal operation state, the voltage at the external negative terminal EN, to which the charger is connected, is input to the external voltage input terminal T25, with the result that large current may flow through a parasitic current path in the control circuit 211, leading to an increase in power consumption.

On the other hand, according to the first embodiment, in the second charge/discharge control circuit 210, the external voltage input terminal T25 is provided separately from the overcurrent cancel terminal T26, and is connected to the one end of the charge control FET 222. The problem as described above can therefore be prevented.

As described above, according to the first embodiment, there can be provided the safer battery device that includes the two charge/discharge control circuits, and is capable of positively returning from the discharge overcurrent detection state to the normal state.

Further, the external voltage input terminal and the overcurrent cancel terminal of the secondary cell-side charge/discharge control circuit are provided separately from each other, and hence the overcurrent cancel terminal can be connected to the external negative terminal, and the external voltage input terminal can be connected to the one end of the charge control FET that is controlled by the secondary cell-side charge/discharge control circuit. A problem of increase in power consumption in the secondary cell-side charge/discharge control circuit can therefore be avoided.

Figure 2:
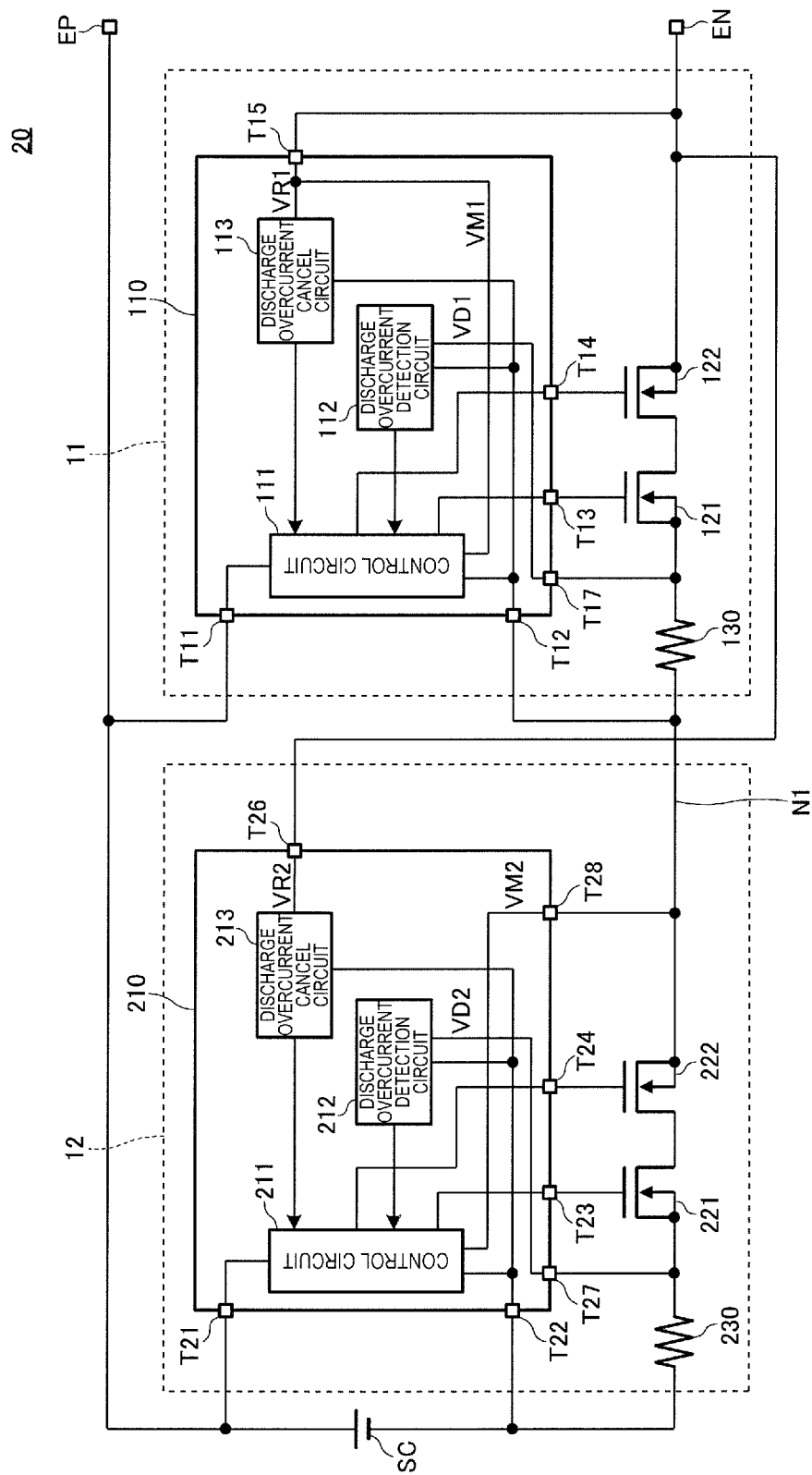
FIG. 2 is a block diagram for illustrating a battery device according to a second embodiment of the present invention.
Figure 3:
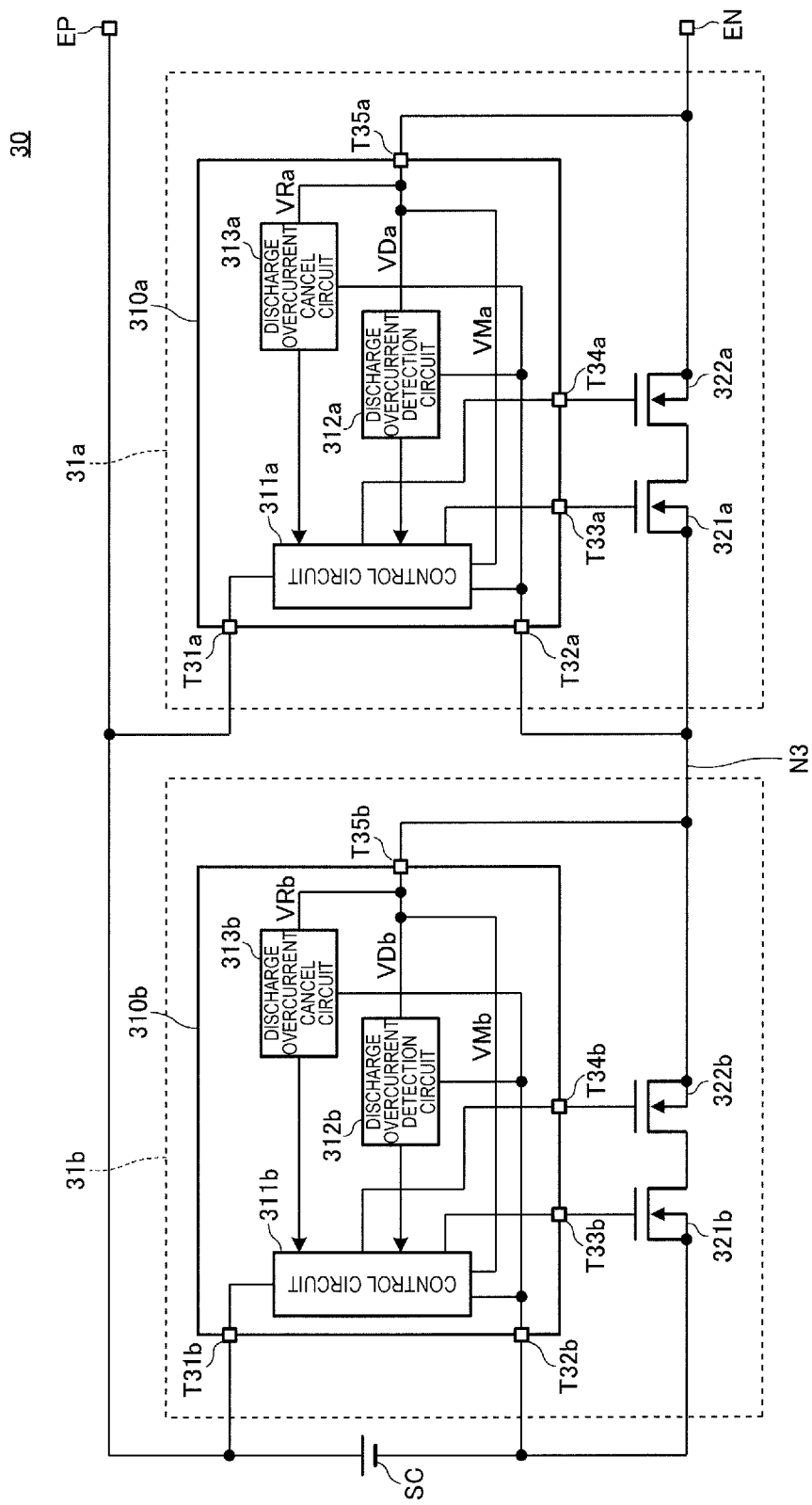
FIG. 3 is a block diagram for illustrating a related-art battery device.

FIG. 2 is a block diagram for illustrating a battery device 20 according to a second embodiment of the present invention.

The battery device 20 of the second embodiment differs from the battery device 10 of the first embodiment in the following configuration.

In the first charge/discharge control circuit 110, a resistor element 130 and an overcurrent detection terminal T17 are added. The resistor element 130 has one end connected to the other end of the discharge control FET 121, and the other end connected to the one end of the charge control FET 222 (node N1), and the overcurrent detection terminal T17 is connected to the one end of the resistor element 130.

In the second charge/discharge control circuit 210, the terminal T25 is removed, and a resistor element 230, an overcurrent detection terminal T27, and an external voltage input terminal T28 are added. The resistor element 230 has one end connected to the other end of the discharge control FET 221, and the other end connected to the negative electrode of the secondary cell SC. The overcurrent detection terminal T27 is connected to the one end of the resistor element 230. The external voltage input terminal T28 is connected to the one end of the charge control FET 222.

The remaining configuration is the same as that of the battery device 10 illustrated in FIG. 1. The same components are therefore denoted by the same reference numerals and redundant description is omitted.

The operation of the battery device 20 is also almost the same as that of the battery device 10 of the first embodiment except that discharge overcurrent is detected based on voltages at terminals different from those in the first embodiment.

In the battery device 20, when an abnormal event occurs in a load (not shown) connected between the external positive terminal EP and the external negative terminal EN and discharge current increases, a large current flows through the charge control FET 122, the discharge control FET 121, the resistor element 130, the charge control FET 222, the discharge control FET 221, and the resistor element 230. Consequently, a voltage difference across the ends of the resistor element 130 and a voltage difference across the ends of the resistor element 230 increase.

As a result, in the first charge/discharge control circuit 110, a voltage VD1 at the overcurrent detection terminal T17 increases and discharge overcurrent is detected based on the increase.

Further, in the second charge/discharge control circuit 210, a voltage VD2 at the overcurrent detection terminal T27 increases and discharge overcurrent is detected based on the increase.

Discharge overcurrent is detected based on voltage a difference across the ends of each of the resistor elements 130 and 230 in this way, and hence detection can be made with higher accuracy than the battery device 10 of the first embodiment.

In order to detect discharge overcurrent based on a voltage difference across the ends of the resistor element 230, the second charge/discharge control circuit 210 includes the overcurrent detection terminal T27 connected to the one end of the resistor element 230, and the external voltage input terminal T28 connected to the one end of the charge control FET 222 (node N1), instead of the terminal T25, which serves as the overcurrent detection terminal and the external voltage input terminal in the battery device 10 of the first embodiment.

Also in the second embodiment, the external voltage input terminal T28 of the second charge/discharge control circuit 210 is provided separately from the overcurrent cancel terminal T26, and is connected to the one end of the charge control FET 222, with the result that it is possible to prevent the problem that may arise when the external voltage input terminal T28 and the overcurrent cancel terminal T26 are made common to connect to the external negative terminal EN.

As described above, also in the second embodiment, effects similar to those of the first embodiment are obtained. In addition, the second embodiment employs the configuration in which discharge overcurrent is detected based on a voltage generated at the resistor element, and thus achieves further improvement of accuracy.

The embodiments of the present invention have been described above, but the present invention is not limited to the above-mentioned embodiments, and it is to be understood that various modifications can be made thereto without departing from the gist of the present invention.

For example, in the case exemplified in the above-mentioned embodiments, the battery device enters a discharge overcurrent state when an abnormal event occurs in a load connected to the battery device, and after that, cancels the discharge overcurrent state based on the fact that the load, in which the abnormal event has occurred, returns to the normal state. However, the present invention is not limited thereto. The present invention also includes a case in which a plurality of loads are connected to the external terminal in a switching manner, and the battery device enters the discharge overcurrent state when an abnormal event occurs in a load connected thereto, and after that, cancels the discharge overcurrent state when the load having the abnormal event is removed or a normal load among the plurality of loads is connected to the external terminal instead.

Further, in the above-mentioned embodiments, the detection of charge overcurrent is not described. However, as a matter of course, the present invention can further have a function to detect charge overcurrent to turn off the charge control FET, thereby stopping charging.

Further, in the description of the above-mentioned embodiments, charging and discharging are controlled by the configuration in which the first charge control FET, the first discharge control FET, the second charge control FET, and the second discharge control FET are connected between the external negative terminal (external terminal) and the negative electrode of the secondary cell SC. Instead of this configuration, charging and discharging may be controlled by a configuration in which the first charge control FET, the first discharge control FET, the second charge control FET, and the second discharge control FET are connected between the external positive terminal (external terminal) and the positive electrode of the secondary cell SC.

What is claimed is:

1. A charge/discharge control circuit for controlling charging and discharging of a secondary cell, the charge/discharge control circuit comprising:
   a positive power supply terminal connected to a positive terminal of the secondary cell;
   a negative power supply terminal connected to a negative terminal of the secondary cell;
   a charge control signal output terminal outputting a charge control signal which controls stopping and allowing of charging to the secondary cell;
   a discharge control signal output terminal outputting a discharge control signal, the discharge control signal becoming a first voltage level to stop discharging of the secondary cell, and becoming a second voltage level to allow discharging of the secondary cell;

an overcurrent detection terminal;

an external voltage input terminal which is different from the positive power supply terminal and the negative power supply terminal and which receives an external voltage signal having a same voltage as that of the charge control signal received by the charge control signal output terminal when the charging to the secondary cell is stopped;

an overcurrent cancel terminal provided separately from the external voltage input terminal;

a discharge overcurrent detection circuit having an input connected to the overcurrent detection terminal, to which a discharge overcurrent detection voltage is set; and a discharge overcurrent cancel circuit having an input connected to the overcurrent cancel terminal, to which a discharge overcurrent cancel voltage is set, the charge control signal being set to a voltage at the external voltage input terminal when the charging to the secondary cell is stopped, the discharge control signal being set to the first voltage level when a voltage at the overcurrent detection terminal exceeds the discharge overcurrent detection voltage, and the discharge control signal being set to the second voltage level when a voltage at the overcurrent cancel terminal falls below the discharge overcurrent cancel voltage.

2. The charge/discharge control circuit according to claim 1, wherein the overcurrent detection terminal is the same terminal as the external voltage input terminal.

3. The charge/discharge control circuit according to claim 2, wherein the discharge overcurrent cancel voltage set to the discharge overcurrent cancel circuit is switched between a first voltage value identical to the discharge overcurrent detection voltage and a second voltage value higher than the first voltage value, depending on the voltage at the overcurrent cancel terminal.

4. The charge/discharge control circuit according to claim 1, wherein the overcurrent detection terminal and the external voltage input terminal are provided separately from each other.

5. The charge/discharge control circuit according to claim 4, wherein the discharge overcurrent cancel voltage set to the discharge overcurrent cancel circuit is switched between a first voltage value identical to the discharge overcurrent detection voltage and a second voltage value higher than the first voltage value, depending on the voltage at the overcurrent cancel terminal.

6. The charge/discharge control circuit according to claim 1, wherein the discharge overcurrent cancel voltage set to the discharge overcurrent cancel circuit is switched between a first voltage value identical to the discharge overcurrent detection voltage and a second voltage value higher than the first voltage value, depending on the voltage at the overcurrent cancel terminal.

7. A battery device, comprising:
a secondary cell;
an external terminal to which a load and a charger are connected;
a first charge/discharge control circuit and a second charge/discharge control circuit connected to the secondary cell;
a first charge control FET configured to be controlled to be turned on and off by a first charge control signal output from the first charge/discharge control circuit, and having one end connected to the external terminal;
a first discharge control FET configured to be controlled to be turned on and off by a first discharge control signal output from the first charge/discharge control circuit, and having one end connected to the other end of the first charge control FET;
a second charge control FET configured to be controlled to be turned on and off by a second charge control signal output from the second charge/discharge control circuit, and having one end connected to the other end of the first discharge control FET; and
a second discharge control FET configured to be controlled to be turned on and off by a second discharge control signal output from the second charge/discharge control circuit, and having one end connected to the other end of the second charge control FET, and the other end connected to the secondary cell, the second charge/discharge control circuit including:
a positive power supply terminal connected to a positive terminal of the secondary cell;
a negative power supply terminal connected to a negative terminal of the secondary cell;
an overcurrent detection terminal;
an external voltage input terminal connected to a terminal that is different from the positive power supply terminal and the negative power supply terminal, and which receives an external voltage signal having a same voltage as that of the charge control signal received by the charge control signal output terminal when the charging to the secondary cell is stopped, and which is connected to the one end of the second charge control FET, and which is configured to receive a voltage turning off the second charge control FET;
an overcurrent cancel terminal provided separately from the external voltage input terminal;
a discharge overcurrent detection circuit, to which a discharge overcurrent detection voltage is set, and configured to turn off the second discharge control FET when a voltage at the overcurrent detection terminal exceeds the discharge overcurrent detection voltage; and
a discharge overcurrent cancel circuit, to which a discharge overcurrent cancel voltage is set, and configured to turn on the second discharge control FET when a voltage at the overcurrent cancel terminal falls below the discharge overcurrent cancel voltage.

8. The battery device according to claim 7, wherein the overcurrent detection terminal is the same terminal as the external voltage input terminal.

9. The battery device according to claim 8, wherein the discharge overcurrent cancel voltage is switched between a first voltage value identical to the discharge overcurrent detection voltage and a second voltage value higher than the first voltage value, depending on the voltage at the overcurrent cancel terminal.

10. The battery device according to claim 7, further comprising a resistor element having one end connected to the other end of the second discharge control FET, and the other end connected to the secondary cell,
wherein the overcurrent detection terminal is provided separately from the external voltage input terminal, and is connected to the one end of the resistor element.

11. The battery device according to claim 10, wherein the discharge overcurrent cancel voltage is switched between a first voltage value identical to the discharge overcurrent detection voltage and a second voltage value higher than the first voltage value, depending on the voltage at the overcurrent cancel terminal.

12. The battery device according to claim 7, wherein the discharge overcurrent cancel voltage is switched between a first voltage value identical to the discharge overcurrent detection voltage and a second voltage value higher than the first voltage value, depending on the voltage at the overcurrent cancel terminal.

13. A battery device, comprising:
a secondary cell;
an external terminal to which a load and a charger are connected;
a first charge/discharge control circuit and a second charge/discharge control circuit connected to the secondary cell;
a first charge control FET configured to be controlled to be turned on and off by a first charge control signal output from the first charge/discharge control circuit, and having one end connected to the external terminal;
a first discharge control FET configured to be controlled to be turned on and off by a first discharge control signal output from the first charge/discharge control circuit, and having one end connected to the other end of the first charge control FET;
a second charge control FET configured to be controlled to be turned on and off by a second charge control signal output from the second charge/discharge control circuit, and having one end connected to the other end of the first discharge control FET; and
a second discharge control FET configured to be controlled to be turned on and off by a second discharge control signal output from the second charge/discharge control circuit, and having one end connected to the other end of the second charge control FET, and the other end connected to the secondary cell,
the second charge/discharge control circuit including:
a positive power supply terminal connected to a positive terminal of the secondary cell;
a negative power supply terminal connected to a negative terminal of the secondary cell;
an overcurrent detection terminal;
an external voltage input terminal that is different from the positive power supply terminal and the negative power supply terminal, and which is connected to the one end of the second charge control FET such that the second charge control FET and the second discharge control FET are electrically connected in series between the external voltage input terminal and the negative power supply terminal, and is configured to receive an external voltage signal, wherein the second charge/discharge control circuit is configured to turn off the second charge control FET by causing the second charge control signal to become a same voltage as the external voltage signal received by the external voltage input terminal;
an overcurrent cancel terminal provided separately from the external voltage input terminal and coupled to the one end of the first charge control FET, wherein the first charge control FET and the first discharge control FET are electrically connected in series between the overcurrent cancel terminal and the external voltage input terminal;
a discharge overcurrent detection circuit, to which a discharge overcurrent detection voltage is set, and configured to turn off the second discharge control FET when a voltage at the overcurrent detection terminal exceeds the discharge overcurrent detection voltage; and
a discharge overcurrent cancel circuit, to which a discharge overcurrent cancel voltage is set, and configured to turn on the second discharge control FET when a voltage at the overcurrent cancel terminal falls below the discharge overcurrent cancel voltage.

* * * * *